United States Patent
Park

(10) Patent No.: US 6,226,222 B1
(45) Date of Patent: May 1, 2001

(54) SYNCHRONOUS SEMICONDUCTOR MEMORY DEVICE HAVING A FUNCTION FOR CONTROLLING SENSE AMPLIFIERS

(75) Inventor: Jung-Hoon Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/359,217

(22) Filed: Jul. 22, 1999

(30) Foreign Application Priority Data

Jul. 25, 1998 (KR) .................................................. 98-30050

(51) Int. Cl.[7] ...................................................... G11C 8/00
(52) U.S. Cl. ............................................. 365/233; 365/94
(58) Field of Search ..................................... 365/233, 194, 365/94, 103, 104

(56) References Cited

U.S. PATENT DOCUMENTS

| | | | |
|---|---|---|---|
| 5,793,665 | * 8/1998 | Kim et al. | 365/104 |
| 5,986,918 | * 11/1999 | Lee | 365/103 |
| 6,031,770 | * 2/2000 | Pawlowski | 365/194 |

* cited by examiner

Primary Examiner—Trong Phan
(74) Attorney, Agent, or Firm—Myers Bigel Sibley & Sajovec

(57) ABSTRACT

A read only memory includes a clock signal source, the clock signal having constantly oscillated pulse periods, a sense amplifier operated by a plurality of control signals, a latch circuit coupled to an output of the sense amplifier, and a circuit for generating the control signals and for generating a latch control signal which is applied to the latch circuit, the sense amplifier control signals being generated in response to an latency information corresponding to the pulse period of the clock signal in a specific frequency condition and the latch control signal being generated in response to an latency counting signal in the specific frequency condition.

12 Claims, 5 Drawing Sheets

SYNCHRONOUS SEMICONDUCTOR MEMORY DEVICE HAVING A FUNCTION FOR CONTROLLING SENSE AMPLIFIERS

FIELD OF THE INVENTION

The present invention relates to a synchronous semiconductor memory, and more particularly to a technique for controlling sense amplifiers employed in a synchronous memory device responding to an external clock signal.

BACKGROUND OF THE INVENTION

It is well known that address transition detection circuits are widely used in semiconductor memories, e.g., read only memories, in order to control internal accessing circuits (e.g. sense amplifier circuits) in an appropriate processing timing, which enhances a sensing speed for stored data and actuates a generation of plural control signals. An address transition detection circuit senses a variation of an external address signal and then generates a master signal informing the address transition. All of control signals employed in performing a sensing operation in a memory device are made from using the master signal, e.g., delaying therefrom or combining therewith, generated from the address transition detection circuit. The ATD-oriented control signals with their own pulse widths and delaying terms between them, independently of an external operating frequency, are fixed into constant values, once after being manufactured, in accordance with a demand of a circuit designing.

In a sensing operation of a read only memory, as one sensing cycle which designates the period from beginning of the sensing operation to latching a result of the sensing is always constant, it would be possible to select a weak cell or to latch distorted sensing data nevertheless of a later sensing timing due to a power noise or a timing variation. Such mis-matched phenomena between the control signals and sensing cycle time causes the yield of a memory device to be reduced. And, a new demand for a sensing time shorter than a designed specification for a sense amplifier might need a newly modified circuit for the address transition detection.

For the purpose of enhancing an operating frequency of an asynchronous memory device, a synchronous memory has been regarded to as an useful way in a high bandwidth memory operation. Since the synchronous memory performs internal operations in response to a system clock which has a predetermined pulse width and frequency and the system clock is assigned to one of several frequency options, the control for the sense amplifiers must be designed to be cooperated with a frequency out of the system clocks.

SUMMARY OF THE INVENTION

Accordingly, it is an object of the invention to provide a synchronous read only memory having a circuits for controlling a sensing operation in accordance with a clock signal which has a constant cycle.

It is another object of the invention to provide a synchronous read only memory having a circuit for controlling a sensing operation over which various clock frequencies are adapted.

It is another object of the invention to provide a synchronous read only memory having a circuit for controlling a sensing operation in various clock frequency conditions, according to predetermined latency informations which correspond to the clock frequency conditions.

In order to accomplish those objects, a read only memory includes a clock signal source, the clock signal having constantly oscillated pulse periods, a sense amplifier operated by a plurality of control signals, a latch circuit coupled to an output of the sense amplifier, and a circuit for generating the control signals and for generating a control signal which is applied to the latch circuit, in response to an information corresponding to the pulse period of the clock signal.

Another aspect of a read only memory includes a clock signal source, the clock signal having constantly oscillated pulse periods, a sense amplifier operated by a plurality of control signals, a latch circuit coupled to an output of the sense amplifier, and a circuit for generating the control signals and for generating a latch control signal which is applied to the latch circuit, the sense amplifier control signals being generated in response to an latency information corresponding to the pulse period of the clock signal in a specific frequency condition and the latch control signal being generated in response to an latency counting signal in the specific frequency conditions. The generating circuit is comprised of at least a selection switch which determines a delaying state of the control signal in response to the latency information signal. The specific frequency condition is when one sensing cycle time of the sense amplifier is longer than that of the pulse period of the clock signal.

Another aspect of the invention is a read only memory including: a master signal source, the master signal being generated when an address signal is changed; a clock signal source, the clock signal having constantly oscillated pulse periods; a sense amplifier operated by a plurality of sense amplifier control signals; a latch circuit coupled to an output of the sense amplifier; a first circuit for generating a first control signal of the sense amplifier control signals; a second circuit for generating a second control signals of the sense amplifier control signals, the second control signal being generated in response to an latency information corresponding to the pulse period of the clock signal in a specific frequency condition; a third circuit for generating a latch control signal which is applied to the latch circuit, the latch control signal being generated in response to an latency counting signal in the specific frequency condition; and a fourth circuit for generating a third control signal of the sense amplifier control signals, the third control signals being activated in response to the master signal and being disabled in response to the latch control signal. In this embodiment, each of the second and third circuits has a selection switch which determines a delaying state of each of the control signals in response to the latency information signal.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF PREFERRED EMBODIMENTS

Hereinbelow, applicable embodiments of the invention will be as follows, with the appended drawings.

Figure 1:
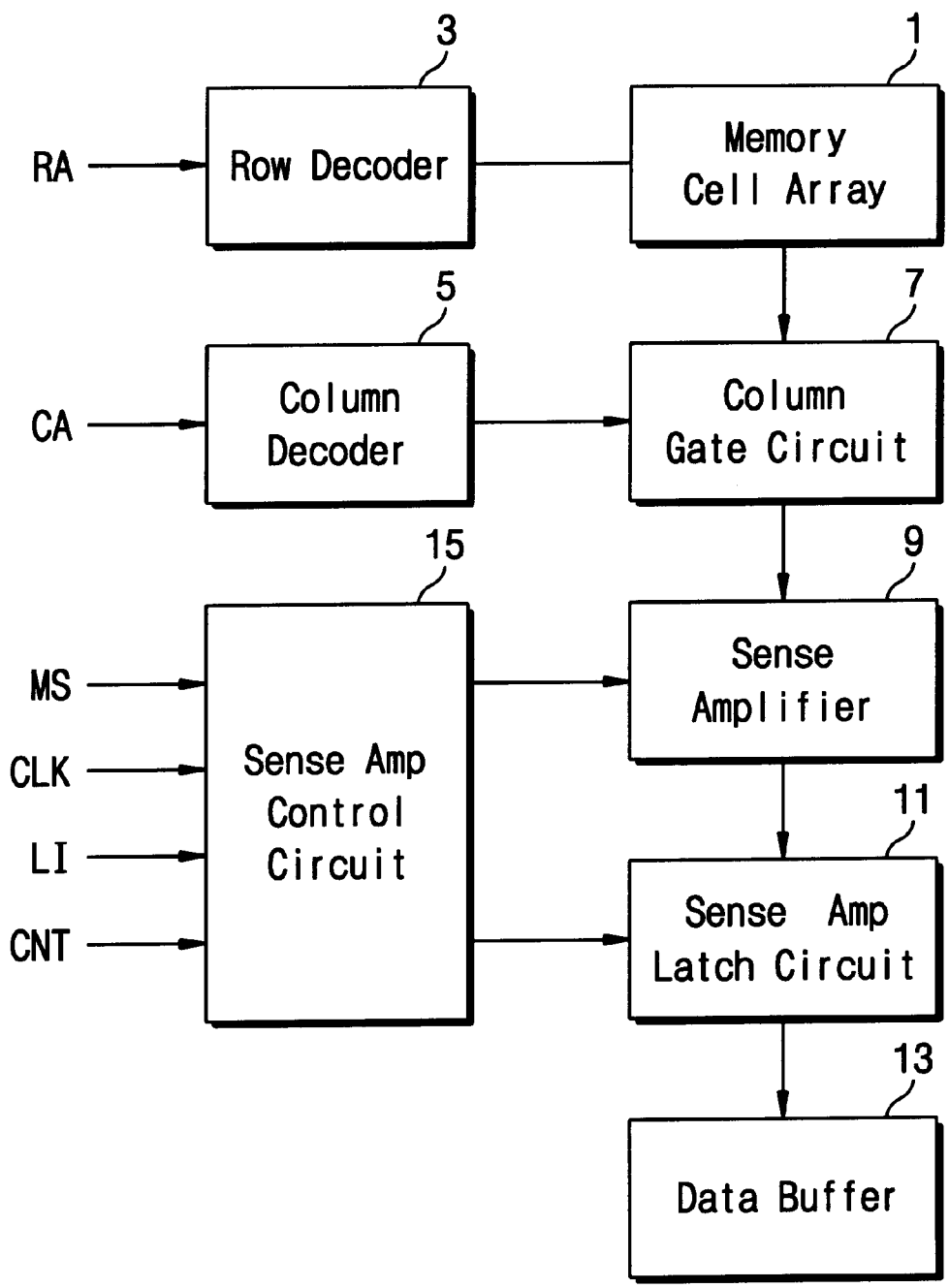
FIG. 1 is a schematic diagram of functional blocks for a sense amplifier control in a synchronous memory.

Referring to FIG. 1 showing a functional construction for performing a sensing operation synchronized with system clock signal CLK in a synchronous memory device according to the present invention, sense amplifier 9 is connected to memory cell array 1 through column gate circuit 7 which is controlled by column decoder 5. Memory cell array is formed of a plurality of read only memory cells which are programmed by means of a mask ion implanting method and coupled to a plurality of bit lines and word lines. The word lines are selected by row decoder 3 in response to row address RA. The bit lines are connected to sense amplifier 9 through column gate 7 in which each column line is connected to each of the bit lines by decoding signals supplied from column decoder 5 in response to column address CA. Outputs from sense amplifier 9 are transferred to data buffer 13 through sense amplifier latch circuit 11. Sense amplifier 9 and latch circuit 11 is coupled to sense amplifier control circuit 15 to which master signal MS, clock signal CLK, and latency information signal LI are applied.

Master signal MS is supplied from an address transition detecting circuit (not shown) which generates a short pulse signal when an address is changed. Latency information signal LI is supplied from a mode register (not shown) which generates signals for determining the number of clock cycle of CLK after an address strobe signal (e.g., column address strobe signal) is activated until a first data bit appears at a data output terminal. The latency is suitably provided to secure a stabilized data detection and a reliable data value in the circumstance of a high bandwidth operation in the synchronous memory device. The value of the latency is proportional to an operating frequency of the synchronous memory device; that is, a lower frequency memory has a smaller latency value, and a higher frequency causes a larger latency. As an example, it is necessary to provide the latency of 3 clock cycles or more when the sense amplifier has a sensing cycle of 30 nanoseconds (ns) and the frequency of the clock signal is 100 MHZ, while only one clock cycles of latency may be enough to cover an operation with the 30 ns—sense amplifier. Thus, sense amplifier control circuit 15 makes sense amplifier 9 and latch circuit 11 be operated in accordance with the latency information that coordinates an optimized sensing sequence.

Figure 2:
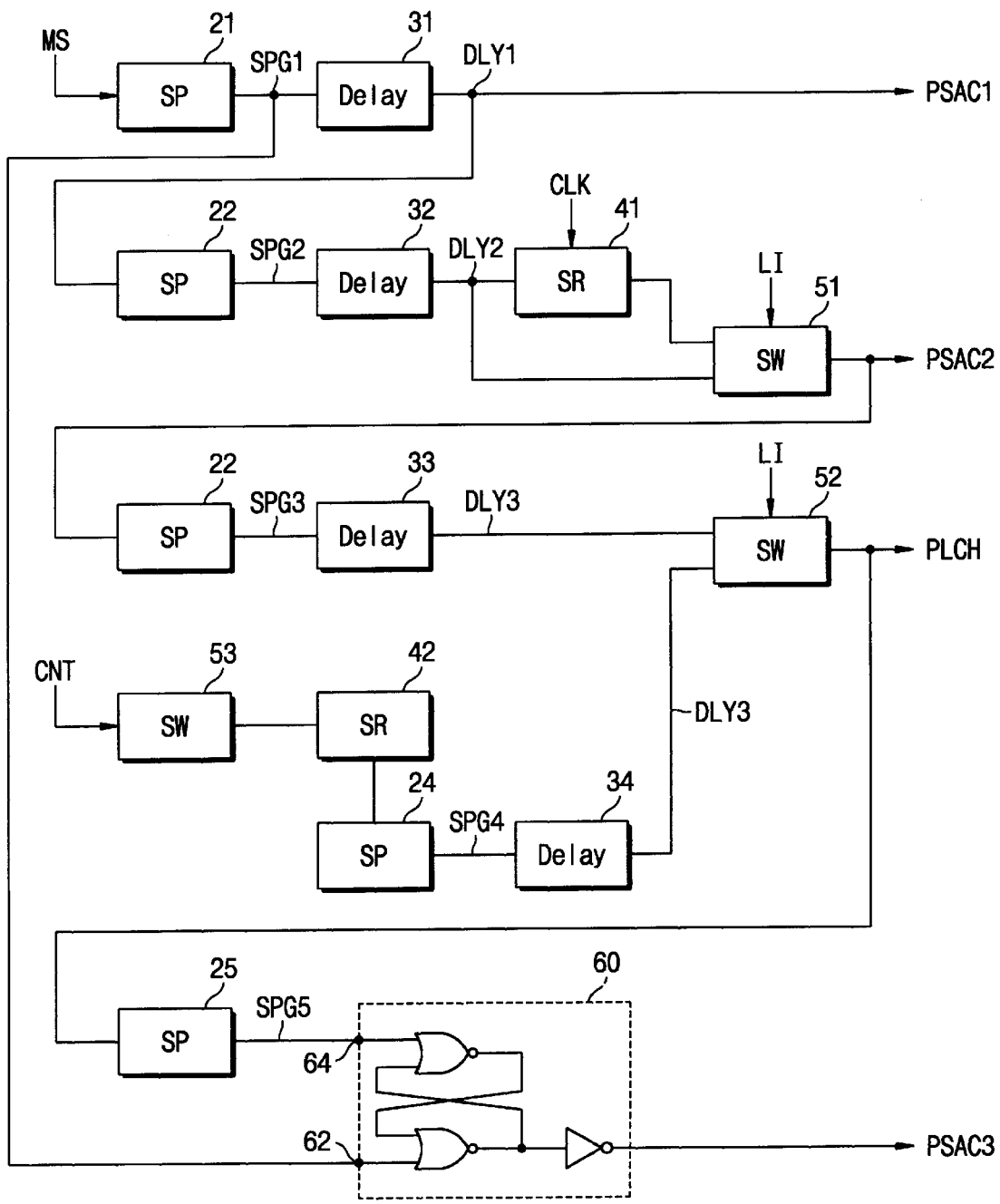
FIG. 2 shows an embodiment of a sense amplifier control circuit for generating control signals to be applied to sense amplifier and sense amplifier latch circuits in a synchronous memory.

FIG. 2 shows an embodiment of the sense amplifier control circuit, assuming that the sense amplifier of FIG. 1 uses three control signals PSAC1, PSAC2, and PSAC3, and the latch circuit 11 responds to PLCH, all the signals being generated from the sense amplifier control circuit. Referring to FIG. 2, master signal MS is applied to short pulse generator 21. Output of short pulse generator 21 is connected to PSAC1 through delay circuit 31. Output of delay circuit 31 is applied to short pulse generator 22. Output of short pulse generator 22 is applied to shift register 41 and selection switch 51. Shift register 41 generates a signal shifted by one clock cycle in response to every input of clock signal CLK. Selection switch 51 alternatively transfers one of the output of shift register 41 and the output of delay circuit 32 in response to latency information signal LI, and thereby PSAC2 corresponds thereto. PSAC2 is also connected to input of short pulse generator 23. Output of short pulse generator 23 is applied to one input terminal of selection switch 52 through delay circuit 33, while, to the other input terminal of selection switch 52, output signal from a latency counter (not shown), CNT, is applied through switch 53, shift register 42, short pulse generator 24, and delay circuit 34. Switch 53 transfers latency counting signal CNT in response to latency information signal LI, and shift register 42 converts CNT to an one-cycle shifted signal according to clocking of CLK. Selection switch 52 alternatively transfers one of the outputs of delay circuits 33 and 34 in response to latency information signal LI in order to generate sense amplifier latch control signal PLCH. PLCH is also applied to one input of gated latch circuit 60 the other input of which is connected to the output of short pulse generator 21. Output of gated latch circuit 60 becomes PSAC3.

The delay circuits coupled to the short pulse generators generate signals having elongated pulse widths from the short pulses made by the short pulse generators. Latency counting signal CNT represents the number of clocks included in one sensing cycle and is provided to advance a sensing stability by delaying a timing of latching as possible within a given sensing period of one cycle. With respect to the structural arrangement of FIG. 2, it should be understood that there are various modifications with the connecting configurations between the short pulse generators, the delay circuits, the shift registers and switches, and with their internal architectures. For instance, the number of stages in the shift register determines the amount of a shifted output signal therefrom.

Figure 3:
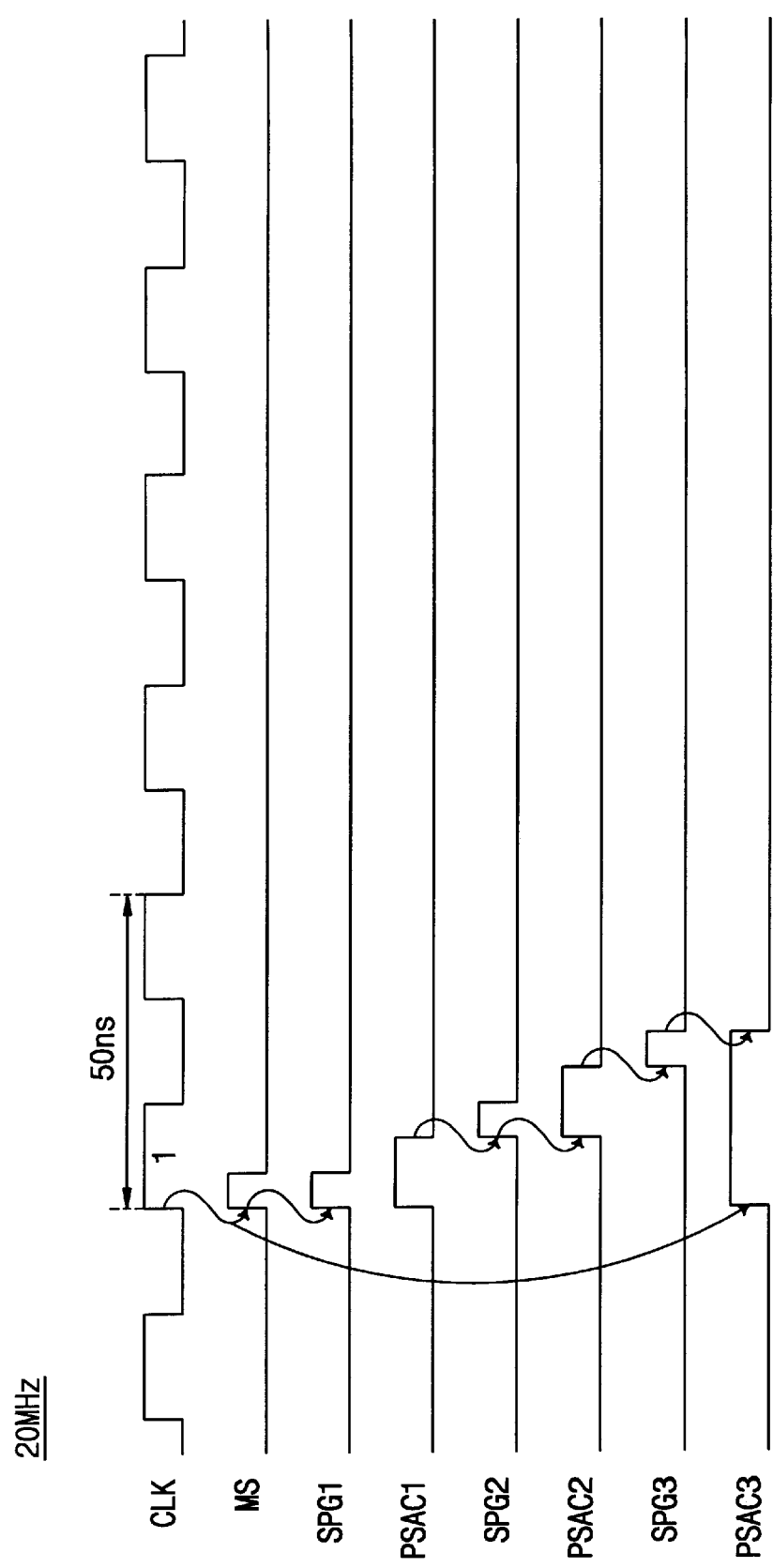
FIG. 3 shows configurations of signals generated from the sense amplifier control circuit of FIG. 2, when the frequency of a system clock applied into the synchronous memory is 20 MHz.

Now, an explanation about a generation respective of the control signals, according to various clock frequency which determines an operating speed of the synchronous memory device, will be described as follows. It is assumed that the time of one sensing cycle in the sense amplifier is about 30 ns. Referring to FIG. 3, in a low frequency like 20 MHZ (this means 50 ns of one clock cycle, not different from that of a normal asynchronous memory), PSAC1 is generated from the output of delay circuit 31 whose input is lead from master signal MS through short pulse generator 21. Since the 50 ns of clock period is enough to cover the sensing cycle of about 30 ns, PSAC2 is generated from PSAC1 just through short pulse generator 22 and delay circuit 32, without adding shift register 41 therethrough. At this time latency information signal LI is 1 that means there is no latency and thereby makes selection switch 51 connect the output of delay circuit 32 directly to PSAC2. As PSAC2 does, PLCH is generated through the path of short pulse generator 23 and delay circuit 33 from PSAC2. Selection switch 52 also connects the output of delay circuit 33 directly to PLCH but disconnects the signal from CNT. PSAC3 which has maintain high-leveled latch state by the former output of short pulse generator 21 falls down to low level in response to PLCH which is applied thereto through short pulse generator 25 and latch circuit 60. As shown in FIG. 3, sense amplifier latch control signal PLCH is activated within one cycle of the clock signal, 50 ns, without applying the latency information.

Figure 4:
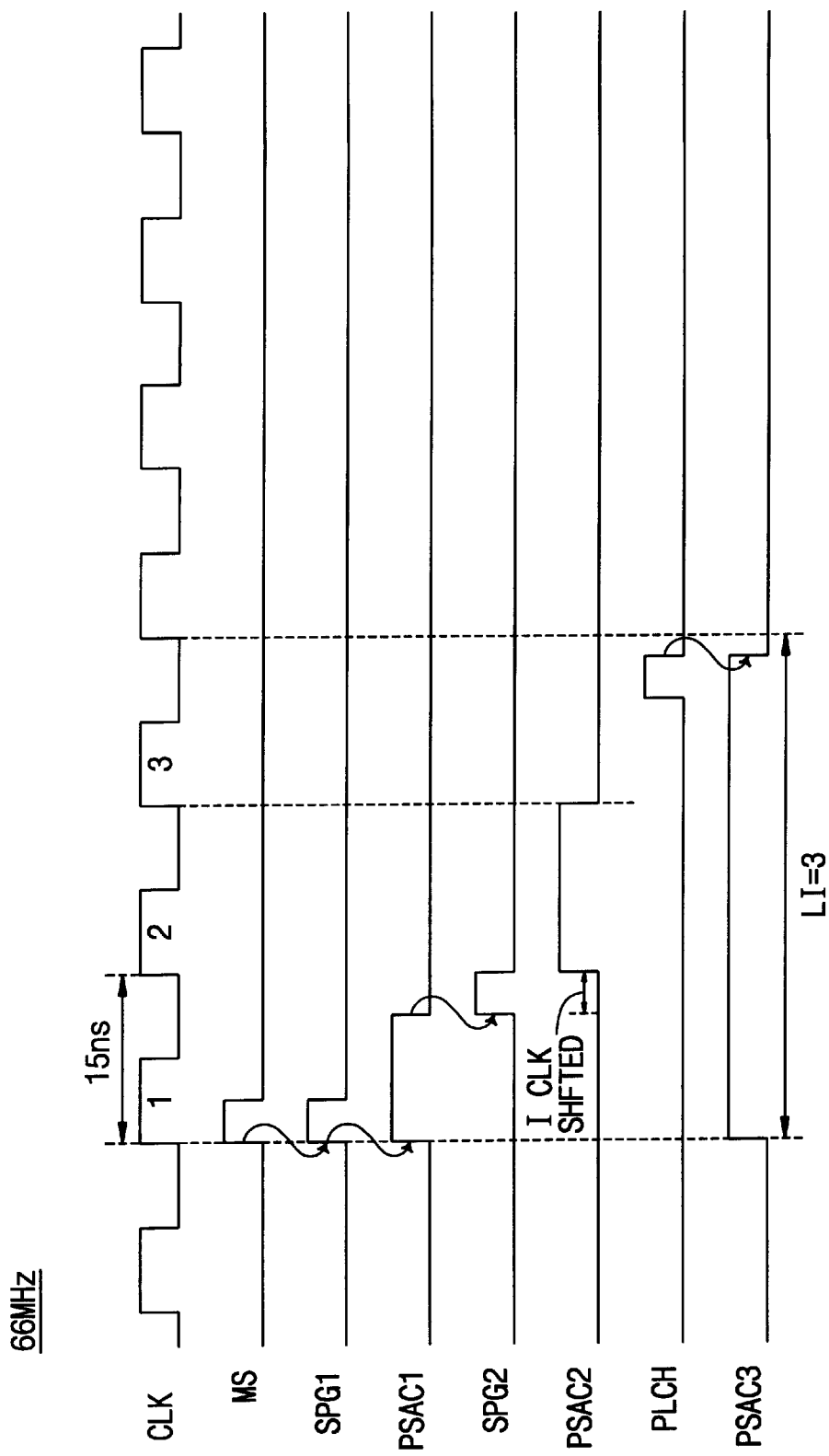
FIG. 4 shows configurations of signals generated from the sense amplifier control circuit of FIG. 2, when the frequency of a system clock supplied into the synchronous memory is 66 MHz.

However, referring to FIG. 4 in which the clock frequency is 66 MHz as a high bandwidth and the latency is set into 3, PSAC2 is generated through short pulse generator 22, delay circuit 32, and shift register 41 from PSAC1. Shift register 41 moves the output signal of delay circuit 32 to the right by one clock pulse as shown in FIG. 4. And then selection switch 51 connects the output of shift register 41 to PSAC2, instead of connecting the output of delay circuit 32 directly to PSAC2. That is because LI applied to selection switch 51 is an effective latency information signal which causes a data bit read from the memory cell array to be transferred to output of the sense amplifier latch circuit within three clock cycles after master signal is activated. Different from the case of FIG. 3, selection switch 52 selects the path oriented from CNT not the path from PSAC2. Thus, PLCH is generated from CNT through switch 53, shift register 42, short pulse generator 24, and delay circuit 34, being activated in the last clock period during the activation of the sense amplifier. The activation of the sense amplifier, which is set by PSAC3, begins with the activation of master signal MS which is applied to input terminal 62 of gated latch circuit 60, and is finished when the output of short pulse generator 25 responding to PLCH is applied to input terminal 64 of gated latch circuit 60.

Figure 5:
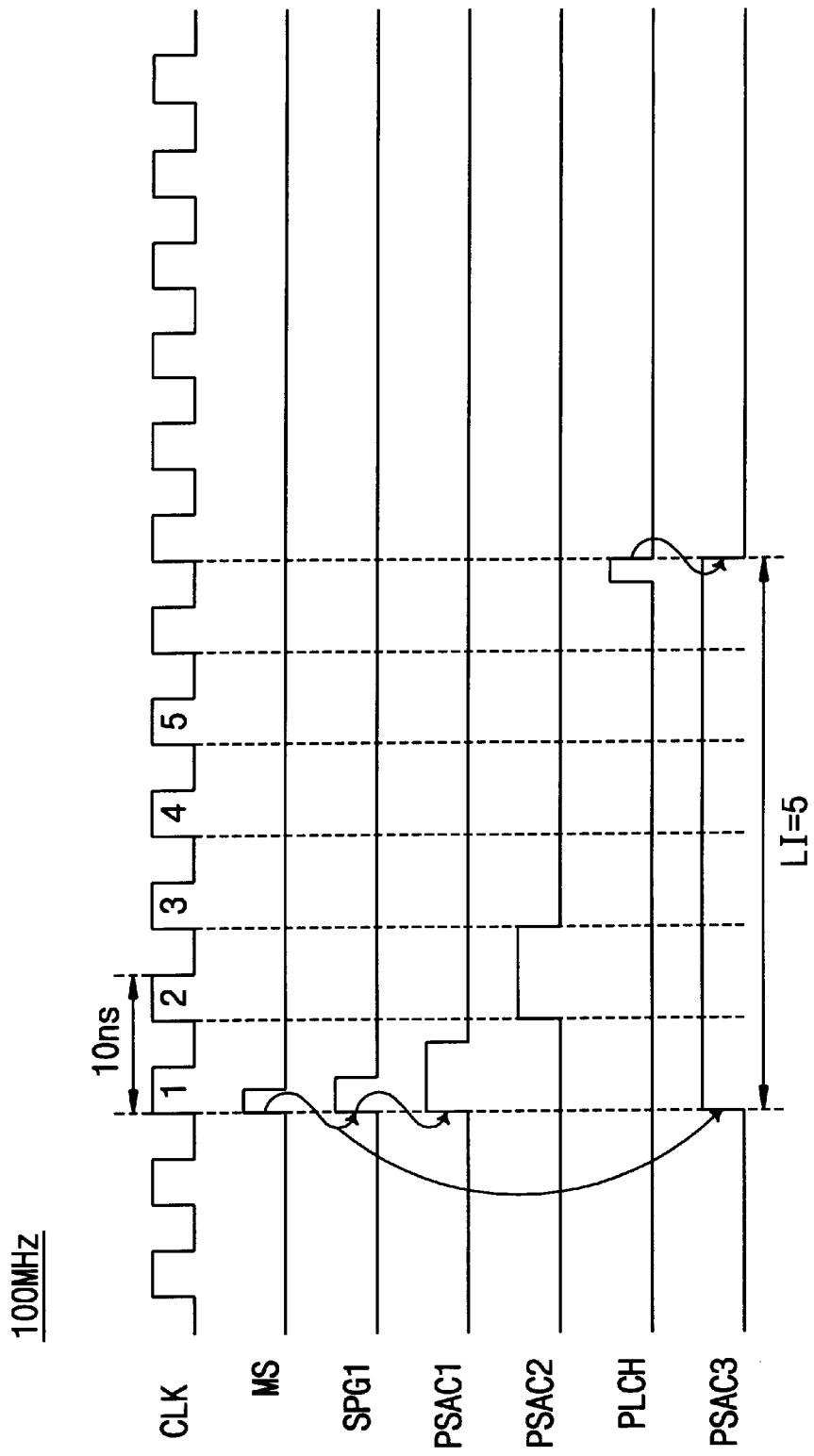
FIG. 5 shows configurations of signals generated from the sense amplifier control circuit of FIG. 2, when the frequency of a system clock supplied into the synchronous memory is 100 MHz.

FIG. 5 shows the case of clock frequency higher than that of FIG. 4, in which 100 MHz is the operating frequency and the latency is 5. While the activation period of the sense amplifier is lasting for five clock cycles of CLK, control signals PSAC2, PLCH, and PSAC3, but PSAC1, are generated by the paths controlled by the present latency information signals as is in FIG. 4.

It could be known that the sequence shown in FIG. 3, as a case of low frequency, is similar to that of the known ATD-oriented and asynchronous control technique, even in the synchronous memory device. However, in the case of that a clock cycle becomes shorter than a sensing period of the sense amplifier in the synchronous memory, as shown in FIGS. 4 and 5, the control signal for sense amplifier latch circuit is forced to be delayed, by the control of the predetermined latency information, so that the sense amplifier can have an enough sensing time for a valid data bit. As a result, the latency signal corresponding to a respective clock frequency established therein makes a complete sensing operation be accomplished and thereby an yield rate is increased.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A read only memory comprising:
   a master signal source, the master signal being generated when an address signal is changed;
   a clock signal source, the clock signal having constantly oscillated pulse periods;
   a sense amplifier operated by a plurality of sense amplifier control signals;
   a latch circuit coupled to an output of the sense amplifier; and
   a sense amplifier control circuit comprising:
      a first circuit for generating a first of the sense amplifier control signals;
      a second circuit for generating a second of the sense amplifier control signals, the second sense amplifier control signal being generated in response to latency information signal corresponding to the pulse period of the clock signal in a specific frequency condition;
      a third circuit for generating a latch control signal which is applied to the latch circuit, the latch control signal being generated in response to a latency counting signal in the specific frequency condition; and
      a fourth circuit for generating a third of the sense amplifier control signals, the third control signal being activated in response to the master signal and is disabled in response to the latch control signal.

2. The read only memory as defined in claim 1 in which each of the second and third circuits has a selection switch which determines a delaying state of each of the control signals in response to the latency information signal.

3. The read only memory as defined in claim 1 in which the specific frequency condition is when one sensing cycle time of the sense amplifier is longer than that of the pulse period of the clock signal.

4. An integrated circuit memory device, comprising:
   a sense amplifier that commences a sensing cycle in-sync with a leading edge of a sense amplifier control signal and terminates the sensing cycle in-sync with a trailing edge of the sense amplifier control signal;
   a sense amplifier latch circuit that receives read data from an output of said sense amplifier during the sensing cycle and latches the read data in-sync with a leading edge of a sense amplifier latch control signal; and
   a sense amplifier control circuit that is responsive to a master signal, generates the sense amplifier latch control signal and generates the sense amplifier control signal having a leading edge in-sync with a leading edge of the master signal and a trailing edge in-sync with a trailing edge of the sense amplifier latch control signal.

5. The memory device of claim 4, wherein said sense amplifier control circuit comprises a gated latch circuit that is responsive to one pulse signal that is generated in-sync with a leading edge of the master signal.

6. The memory device of claim 5, wherein the gated latch circuit is responsive to another pulse signal that is generated in-sync with a leading edge of the sense amplifier latch control signal.

7. The memory device of claim 4, wherein said sense amplifier control circuit is responsive to a latency count signal.

8. The memory device of claim 4, wherein said sense amplifier control circuit is responsive to a latency count signal and a latency information signal.

9. An integrated circuit memory device, comprising:
   a sense amplifier control circuit that is responsive to a master signal and generates a sense amplifier latch control signal and first, second and third sense amplifier control signals, said third sense amplifier control signal having a leading edge in-sync with a leading edge of the master signal and a trailing edge in-sync with a trailing edge of the sense amplifier latch control signal;
   a sense amplifier that commences a sensing cycle in-sync with a leading edge of the third sense amplifier control signal and terminates the sensing cycle in-sync with a trailing edge of the third sense amplifier control signal; and
   a sense amplifier latch circuit that receives read data from an output of said sense amplifier during the sensing cycle and latches the read data in-sync with a leading edge of a sense amplifier latch control signal.

10. The memory device of claim 9, wherein said sense amplifier control circuit comprises a gated latch circuit that is responsive to one pulse signal that is generated in-sync with a leading edge of the master signal; and wherein the gated latch circuit generates the third sense amplifier control signal.

11. The memory device of claim 10, wherein the gated latch circuit is responsive to another pulse signal that is generated in-sync with a leading edge of the sense amplifier latch control signal.

12. The memory device of claim 11, wherein said sense amplifier control circuit is responsive to a latency count signal and a latency information signal.

* * * * *